United States Patent
Ono (10) Patent No.: US 8,786,177 B2
(45) Date of Patent: Jul. 22, 2014

(54) SINGLE-PHOTON TYPE ORGANIC ELECTROLUMINESCENT ELEMENT

(75) Inventor: Yoshinobu Ono, Tsukubamirai (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/498,430

(22) PCT Filed: Sep. 22, 2010

(86) PCT No.: PCT/JP2010/066363
§ 371 (c)(1),
(2), (4) Date: Mar. 27, 2012

(87) PCT Pub. No.: WO2011/040294
PCT Pub. Date: Apr. 7, 2011

(65) Prior Publication Data
US 2012/0181921 A1    Jul. 19, 2012

(30) Foreign Application Priority Data
Sep. 29, 2009 (JP) .................. 2009-224847

(51) Int. Cl.
*H01J 1/62* (2006.01)
*H01J 63/04* (2006.01)

(52) U.S. Cl.
USPC ........... 313/504; 313/483; 313/498; 313/499; 313/500; 313/501; 313/502; 313/503; 313/505; 313/506

(58) Field of Classification Search
None
See application file for complete search history.

(56) References Cited

U.S. PATENT DOCUMENTS

| 6,541,130 | B2* | 4/2003 | Fukuda | 428/690 |
| 6,903,506 | B2* | 6/2005 | Kita et al. | 313/506 |
| 6,949,878 | B2* | 9/2005 | Suzuri et al. | 313/506 |
| 7,598,670 | B2* | 10/2009 | Kumaki et al. | 313/506 |
| 8,080,934 | B2* | 12/2011 | Kido et al. | 313/504 |
| 2003/0044639 | A1 | 3/2003 | Fukuda | |

(Continued)

FOREIGN PATENT DOCUMENTS

| JP | 07-220871 A | 8/1995 |
| JP | 2000-323277 A | 11/2000 |

(Continued)

OTHER PUBLICATIONS

Japanese Office Action issued in corresponding JP Application No. 2009224847, dated Sep. 5, 2013.

(Continued)

*Primary Examiner* — Natalie Walford
(74) *Attorney, Agent, or Firm* — Sughrue Mion, PLLC (57) ABSTRACT

An object of the present invention is to provide an organic EL element including a plurality of light-emitting layers which each emit light having a different peak wavelength, and having excellent light-emitting performances such as light-emitting intensity with a simple structure.

The present invention is a single-photon type organic electroluminescent element including a first electrode having optical transparency, a second electrode, and a plurality of light-emitting layers disposed between the first and second electrodes, wherein the plurality of light-emitting layers stacked between the first and second electrodes each emit light having a different peak wavelength, and each of the light-emitting layers is disposed separately from the second electrode at such a position that optical resonance is generated by reflected light emitted from a predetermined light-emitting layer toward the second electrode and reflected by the second electrode to return, and light emitted from the predetermined light-emitting layer toward the first electrode.

8 Claims, 2 Drawing Sheets

(56) References Cited

U.S. PATENT DOCUMENTS

| | | |
|---|---|---|
| 2003/0189401 A1 | 10/2003 | Kido et al. |
| 2004/0033388 A1 | 2/2004 | Kim et al. |
| 2004/0066138 A1 | 4/2004 | Kanno et al. |
| 2004/0227460 A1 | 11/2004 | Liao et al. |
| 2005/0089716 A1 | 4/2005 | Nakaya et al. |
| 2007/0024168 A1 | 2/2007 | Nishimura et al. |
| 2007/0035234 A1* | 2/2007 | Lee .............................. 313/503 |
| 2007/0035243 A1* | 2/2007 | Lee .............................. 313/506 |
| 2007/0182317 A1 | 8/2007 | Kido et al. |
| 2010/0033090 A1 | 2/2010 | Kumaki et al. |

FOREIGN PATENT DOCUMENTS

| | | |
|---|---|---|
| JP | 2003-272860 A | 9/2003 |
| JP | 2004-079535 A | 3/2004 |
| JP | 2004127602 A | 4/2004 |
| JP | 2004-342614 A | 12/2004 |
| JP | 2005-120071 A | 5/2005 |
| JP | 2006-013458 A | 1/2006 |
| JP | 2007-035579 A | 2/2007 |
| JP | 2007053090 | 3/2007 |
| JP | 2007053091 | 3/2007 |
| JP | 2007-242498 A | 9/2007 |
| JP | 2007-265638 A | 10/2007 |
| JP | 2008-034362 A | 2/2008 |
| JP | 2009-049223 A | 3/2009 |
| WO | 94/07344 A1 | 3/1994 |

OTHER PUBLICATIONS

Japanese Office Action issued in corresponding JP Application No. 2009-224847, dated Mar. 4, 2014.

* cited by examiner

SINGLE-PHOTON TYPE ORGANIC ELECTROLUMINESCENT ELEMENT

TECHNICAL FIELD

The present invention relates to an organic electroluminescent element (hereinafter may be referred to as an "organic EL element"), and particularly to a single-photon type organic EL element, and a light-emitting device and a display device which are provided with the same.

BACKGROUND ART

An organic EL element includes a pair of electrodes (anode and cathode) and a light-emitting layer placed between the electrodes as main components. The organic EL element is substantially characterized in that organic compounds are used as materials for the light-emitting layer. The organic EL element emits light of certain color and intensity by application of a voltage between the electrodes.

In order to improve characteristics such as the intensity and spectral width of light emitted from the organic EL element, use of an optical resonance phenomenon has been investigated. For example, proposed is a so-called single-photon type organic EL element in which a transparent electrode, a single light-emitting layer, and a back electrode are stacked in this order on a transparent substrate. In this organic EL element, a semitransparent reflective film is provided between the transparent substrate and the transparent electrode, and an optical micro resonator is configured thereinside by setting an optical distance between the semitransparent reflective film and the back electrode to one wavelength or an integral multiple of one wavelength (see, for example, Patent Literature 1).

Further, it has been proposed that in a multi-photon type organic EL element in which a plurality of light-emitting units are stacked with an intermediate unit placed therebetween, each of the light-emitting units is disposed at such a position that beams of light emitted from the light-emitting units each resonate to improve light-emitting characteristics of the organic EL element. Specifically, an organic EL element has been proposed in which an optical distance between the light-emitting position of each light-emitting unit and an anode which reflects light is set so as to cause an optical resonance phenomenon, whereby the light-emitting units each satisfy optical resonance conditions (see, for example, Patent Literature 2).

CITATION LIST

Patent Literature

Patent Literature 1: International Publication No. 94/07344
Patent Literature 2: Japanese Patent Application Laid-Open No. 2007-35579

DISCLOSURE OF INVENTION

Technical Problem

As described above, techniques of improving light-emitting characteristics of an organic EL element using optical resonance has been developed. However, when a light-emitting device which emits white light is realized using the above-described techniques, there are problems described below.

As a configuration of the light-emitting device which emits white light, three following constitutions are exemplified.
(1) A light-emitting device comprising an organic EL element provided with a light-emitting layer which emits white light.
(2) A light-emitting device in which three organic EL elements consisting of an organic EL element including a light-emitting layer which emits red light (hereinafter may referred to as a "red light-emitting layer"), an organic EL element including a light-emitting layer which emits blue light (hereinafter may be referred to as a "blue light-emitting layer"), and an organic EL element including a light-emitting layer which emits green light (hereinafter may be referred to as a "green light-emitting layer") are disposed on a substrate, so that three kinds of red, blue, and green lights emitted from respective organic EL elements are mixed to produce white light.
(3) A light-emitting device comprising a multi-photon type organic EL element in which three light-emitting units consisting of a light-emitting unit including a red light-emitting layer, a light-emitting unit including a blue light-emitting layer, and a light-emitting unit including a green light-emitting layer are stacked with a so-called intermediate unit placed therebetween.

In the light-emitting device comprising an organic EL element including a light-emitting layer which emits white light as described in the above (1), when a distance between the light-emitting layer which emits white light and an electrode which reflects light is set to a certain distance, light having a very narrow and specific wavelength band in the white light having a wide wavelength band satisfies the resonance conditions. However, light having most of wavelength bands other than the very narrow and specific wavelength band does not sufficiently satisfy the resonance conditions. Accordingly, with respect to the light having most of wavelength bands other than the very narrow and specific wavelength band in the white light having a wide wavelength band, it is difficult to obtain effects of optical resonance.

Further, in the light-emitting device in which three kinds of organic EL elements are disposed on a substance as described in the above (2), a distance between each light-emitting layer and an electrode surely can be set each organic EL element to a certain value, whereby the effects of optical resonance in each kind of each organic EL element can be obtained. However, since the organic EL elements each need to have a different structure, it is difficult to establish a common production process. For this reason, the production process is individually established according to the kinds of organic EL elements. This causes a problem in which the production process is extremely complicated.

Further, in the light-emitting device comprising a so-called multi-photon type organic EL element in which three light-emitting units are stacked as described in the above (3), a distance for optical resonance of one among these units is set in consideration of thicknesses of the other light-emitting units. Therefore, the thicknesses of the other light-emitting units including the aforementioned intermediate unit need to be formed in accordance with an intended design. Accordingly, since tolerance of thicknesses including that of the intermediate unit is strict, the production process is sophisticated. Further, since the intermediate unit is usually formed by a dry method, a vacuum process is necessary. For example, when layers such as the light-emitting layers excepting the intermediate unit are formed by a wet process, the vacuum process is necessary in the middle of the production process. This causes a problem in which the production process is extremely complicated.

Accordingly, an object of the present invention is to provide an organic EL element including a plurality of light-emitting layers which each emit light having a different peak wavelength, and having excellent light-emitting performances such as light-emitting intensity with a simple structure.

Solution to Problem

The present invention provides an organic EL element having the following configuration in order to solve the above problems.

[1] A single-photon type organic electroluminescent element comprising:
a first electrode having optical transparency;
a second electrode; and
a plurality of light-emitting layers disposed between the first and second electrodes, wherein
the plurality of light-emitting layers stacked between the first and second electrodes each emit light having a different peak wavelength, and
each of the light-emitting layers is disposed separately from the second electrode at such a position that optical resonance is generated by reflected light emitted from a predetermined light-emitting layer toward the second electrode and reflected by the second electrode to return, and light emitted from the predetermined light-emitting layer toward the first electrode.

[2] The organic electroluminescent element according to above [1], wherein a light-emitting layer which emits light having a longer peak wavelength among the plurality of light-emitting layers is disposed at a position closer to the first electrode between the first and second electrodes.

[3] The organic electroluminescent element according to above [2], wherein the first electrode is an anode and the second electrode is a cathode.

[4] The organic electroluminescent element according to any one of above [1] to [3], wherein the plurality of light-emitting layers comprise a light-emitting layer which emits red light, a light-emitting layer which emits green light, and a light-emitting layer which emits blue light.

[5] The organic electroluminescent element according to any one of above [1] to [4], wherein a distance between a light-emitting center portion of a k-th light-emitting layer, "k" representing a natural number, counted from a side of the first electrode among the plurality of light-emitting layers and a portion of the second electrode which reflects light falls within a range of 0.9 to 1.1 times a resonance distance $d_k$ represented by the following Equation (1):

$$d_k = \frac{m_k \lambda_k}{4n}$$ [Numerical Formula 1]

wherein $\lambda_k$ represents a peak wavelength of light emitted from the k-th light-emitting layer, n represents an average refractive index of a member placed between the k-th light-emitting layer and the second electrode, and $m_k$ is a positive odd number.

[6] The organic electroluminescent element according to any one of above [1] to [5], wherein the plurality of light-emitting layers are formed by a coating method.

[7] A light-emitting device comprising the organic electroluminescent element according to any one of above [1] to [6].

[8] A display device comprising the organic electroluminescent element according to any one of above [1] to [6] and a color filter disposed at such a position that light emitted from the organic electroluminescent element passes.

Effects of Invention

According to the present invention, a single-photon type organic EL element formed by stacking a plurality of light-emitting layers which each emit light having a different peak wavelength is employed, and a distance between an electrode and each light-emitting layer is set to such a distance that light emitted from each light-emitting layer resonates depending on the peak wavelength of the light; thus, the effects of optical resonance can be obtained in the respective light-emitting layers with a simple structure being maintained. Therefore, although the organic EL element has a simple structure, light-emitting intensity toward a front direction can be increased, and spectrum band of the light emitted from each light-emitting layer can be narrowed. Further, the organic EL element of the present invention can has a simple structure as compared with a multi-photon type element, and therefore the production process can be simplified.

According to the present invention, the spectrum band of the light emitted from each light-emitting layer can be narrowed. In a display device including the organic EL element of the present invention and a color filter in combination, the spectrum band is narrowed by utilizing optical resonance. As a result, a proportion of light which does not penetrate the color filter, such as a proportion of light corresponding to a tail part of a spectral curve, can be decreased. Therefore, a loss of light during use of the color filter can be decreased, and utilization efficiency of light emitted from the element can be improved. Further, narrowing of the spectrum band of the light emitted from each light-emitting layer can increase an region that can be represented by mixing lights emitted from the respective light-emitting layers when the color of the light emitted from each light-emitting layer is represented by a color coordinate. Thus, in the display device including the organic EL element of the present invention and the color filter in combination, the range of color that can be reproduced as color of the light emitted from the organic EL element and color of light transmitted through the color filter is expanded.

EXPLANATIONS OF LETTERS OR NUMERALS 10 supporting substrate
20 first electrode
30 hole injection layer
40 light-emitting layered body
41 red light-emitting layer
42 green light-emitting layer
43 blue light-emitting layer
50 electron injection layer
60 second electrode
60a reflective surface

DESCRIPTION OF EMBODIMENTS

Hereinafter, embodiments of the present invention will be described with reference to the drawings. Since an element structure and the like are schematically represented for easy understanding, the scale size of respective members in the drawings is sometimes different from the actual scale size. The present invention is not limited to the following description, and the embodiments can be appropriately modified without departing from the scope of the present invention. The members which are usually provided in a light-emitting device provided with an organic EL element, such as leads of an electrode, are omitted in the drawings since they are not directly necessary for the description of the present invention. For convenience of description of a layer structure and the like, the present invention will be described with reference to an example shown below and a diagram in which a supporting substrate is disposed below. However, the organic EL element of the present invention and a light-emitting device provided with the same are not necessarily produced or used in this arrangement. In the following description, one of thickness directions of the supporting substrate is may referred to as upward and the other was may referred to as downward.

<1. Organic EL Element of the Present Invention>

The organic EL element of the present invention is a single-photon type organic electroluminescent element including a first electrode having optical transparency, a second electrode, and a plurality of light-emitting layers disposed between the first and second electrodes. In this organic EL element, the plurality of light-emitting layers stacked between the first and second electrodes each emit light having a different peak wavelength, and each of the light-emitting layers is disposed separately from the second electrode at such a position that optical resonance is generated by reflected light emitted from a predetermined light-emitting layer toward the second electrode and reflected by the second electrode to return, and light emitted from the predetermined light-emitting layer toward the first electrode.

An organic EL element is generally provided on a supporting substrate. On the supporting substrate, wiring for supply of electrical power to the organic EL element are formed. For example, when the organic EL element is applied to an active matrix type display device, a TFT (Thin Film Transistor) substrate is used as the supporting substrate.

The organic EL element is broadly divided into a so-called bottom emission type element, which emits light toward a supporting substrate, and a so-called top emission type element, which emits light toward an opposite side of the supporting substrate. The present invention can be applied to both emission type elements.

Figure 1:
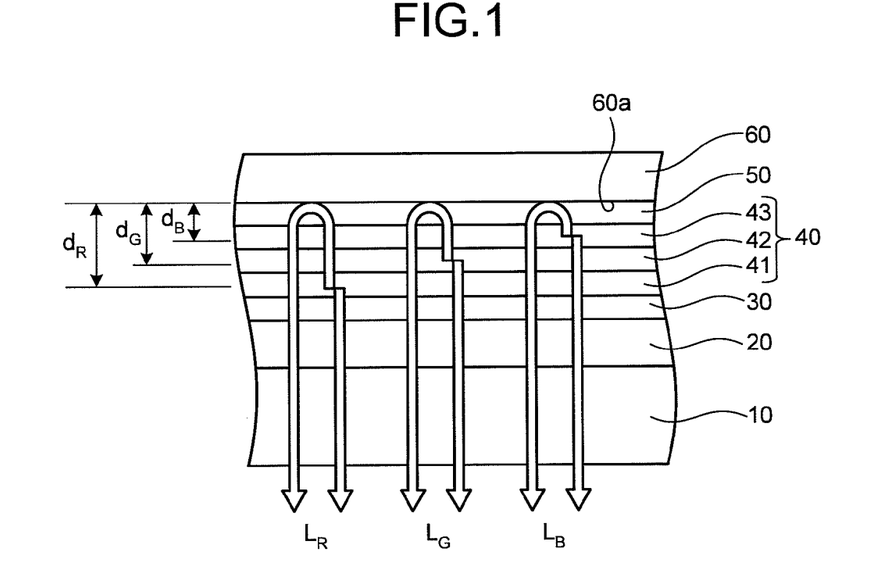
FIG. 1 is a side view schematically showing the configuration of an organic EL element in a first embodiment.

Hereinafter, the organic EL element of the present invention will be described in detail while an organic EL element of a first embodiment of the present invention (hereinafter the "organic EL element of the first embodiment" is simply referred to as the "element of the first embodiment") is appropriately referred as an example. The element of the first embodiment is shown in FIG. 1. FIG. 1 is a diagram of the element of the first embodiment as viewed from a side, and schematically showing a layer configuration thereof and travelling of light. The element of the first embodiment is a bottom emission type element.

The element of the first embodiment is provided on a supporting substrate 10. In the bottom emission type organic EL element, since emitted light passes through the supporting substrate 10 and goes out, a substrate having optical transparency is used as the supporting substrate 10.

The element of the first embodiment includes a pair of electrodes comprising a first electrode 20 having optical transparency and a second electrode 60. In the bottom emission type element, the first electrode 20 having optical transparency out of the pair of electrodes is disposed at a position closer to the supporting substrate 10.

A plurality of light-emitting layers are provided between the first and second electrodes. As the plurality of light-emitting layers in the element of the first embodiment, three light-emitting layers including a red light-emitting layer 41, a green light-emitting layer 42, and a blue light-emitting layer 43 are stacked (hereinafter these light-emitting layers may be collectively referred to as a light-emitting layered body 40).

Each of the light-emitting layers is a light-emitting layer which emits light having a different peak wavelength. It is preferable that the light-emitting layer which emits light having a longer peak wavelength among the plurality of light-emitting layers is disposed at a position closer to the first electrode between the first and second electrodes. In the element of the first embodiment, it is preferable that the three light-emitting layers are disposed in the order of the red light-emitting layer 41, the green light-emitting layer 42, and the blue light-emitting layer 43 from a side of the first electrode 20.

Further, it is preferable that the first electrode is an anode and the second electrode is a cathode. In the element of the first embodiment, an anode is provided as the first electrode 10 having optical transparency and a cathode is provided as the second electrode 60.

If necessary, certain layers other than the light-emitting layers may be provided between the first and second electrodes. Examples of the certain layers may include a hole injection layer, a hole transport layer, an electron injection layer, and an electron transport layer. These certain layers may be provided, for example, between the electrode and the light-emitting layer or between the light-emitting layers, if needed. As an example of configuration of an element having the certain layers, a hole injection layer 30 is provided between the first electrode 20 and the red light-emitting layer 41, and an electron injection layer 50 is provided between the green light-emitting layer 43 and the second electrode 60 in the element of the first embodiment. Therefore, in the element of the first embodiment, the first electrode 20, the hole injection layer 30, the red light-emitting layer 41, the green light-emitting layer 42, the blue light-emitting layer 43, the electron injection layer 50, and the second electrode 60 are stacked in this order on the supporting substrate 10.

"Light" used herein means an electromagnetic wave having a wavelength of about 1 nm to about 1 mm, and having optical transparency means that at least part of light entering a certain member penetrates the certain member. Light used herein means one having a wavelength range of an electromagnetic wave emitted from a light-emitting layer, and usually one having a wavelength range of visible light.

A. Light-Emitting Layer

A so-called multi-photon type organic EL element in which a plurality of light-emitting units each having a light-emitting layer are stacked in a plurality of tiers includes a plurality of light-emitting layers as similar to the single-photon type element of the first embodiment. However, in the case of the multi-photon type organic EL element, a member, for example, referred to as a charge generating layer or an intermediate unit is provided between the light-emitting layers as different from the element of the first embodiment. The charge generating layer and the intermediate unit exert a function like an electrode. Accordingly, when a voltage is applied, holes and electrons are generated in the charge generating layer, the electrons are injected into the layer adjacent to an anode side with respect to the charge generating layer, and the holes are injected into the layer adjacent to a cathode side with respect to the charge generating layer.

On the other hand, the organic EL element of the present invention is a single-photon type element in which a plurality of light-emitting layers are stacked between the light-emitting layers and in which a member exerting a function like an electrode, referred to as a charge generating layer or an intermediate unit, is not provided. In the element of the first embodiment shown in FIG. 1, the three layers of the red light-emitting layer 41, the green light-emitting layer 42, and the blue light-emitting layer 43 are stacked to form the light-emitting layered body 40, and the members referred to as a charge generating layer or an intermediate unit are not placed between the light-emitting layers.

Each of the light-emitting layers is disposed separately from the second electrode at such a position that optical resonance is generated by reflected light emitted from a predetermined light-emitting layer toward the second electrode and reflected by the second electrode to return, and light emitted from the predetermined light-emitting layer toward the first electrode.

In the light-emitting layers, distribution in light-emitting intensity is sometimes generated in a thickness direction thereof, and a portion of the second electrode which reflects light is not limited to the surface of the second electrode and is sometimes present within the inside thickness thereof. For this reason, it is preferable that a distance between the light-emitting layer and the second electrode is determined based on a light-emitting center portion in which a light-emitting intensity is the highest in the light-emitting layer and the portion of the second electrode which reflects light (which is not limited to the surface of the second electrode, and is sometimes a certain portion within the inside thickness thereof). Specifically, it is preferable that a distance between a light-emitting center portion of a k-th light-emitting layer counted from the first electrode side—"k" represents a natural number—among the plurality of light-emitting layers and the portion of the second electrode which reflects light fall within a range of 0.9 to 1.1 times a resonance distance $d_k$ represented by the following Equation (1).

$$d_k = \frac{m_k \lambda_k}{4n} \qquad \text{[Numerical Formula 2]}$$

In Equation (1), $\lambda_k$ represents a peak wavelength of light emitted from the k-th light-emitting layer, n represents an average refractive index of a member placed between the k-th light-emitting layer and the second electrode, and $m_k$ is a positive odd number.

In the element of the first embodiment, among the plurality of light-emitting layers, a first light-emitting layer (k=1) counted from a side of the first electrode 20 corresponds to the red light-emitting layer 41, a second light-emitting layer (k=2) counted from the side of the first electrode 20 corresponds to the blue light-emitting layer 42, and a third light-emitting layer (k=3) counted from the side of the first electrode 20 corresponds to the green light-emitting layer 43.

When the k-th light-emitting layer counted from the first electrode side is disposed at such a position that the distance between the light-emitting center portion of the light-emitting layer and the portion of the second electrode which reflects light satisfies the range of 0.9 to 1.1 times the resonance distance $d_k$ represented by the above Equation (1), optical resonance is generated by reflected light emitted from the light-emitting layer toward the second electrode and reflected by the second electrode to return, and light emitted from the light-emitting layer toward the first electrode, thereby enhancing the light. In the element of the first embodiment, a principal surface closer to the first electrode side of both principal surfaces of the second electrode 60 corresponds to the portion of the second electrode 60 which reflects light. Therefore, this principal surface is hereinafter referred to as a reflective surface 60a. As described above, the portion of the second electrode which reflects light may be present within the inside thickness of the second electrode 60. For example, a plate-shape conductive member having optical transparency, such as an ITO thin film described below, and a plate-shape conductive member which reflects light, such as an Al thin film described below, are stacked to form a layered body for the second electrode 60, and the plate-shape conductive member having optical transparency is disposed on the side of the first electrode. In this case, an interface between the plate-shape conductive member having optical transparency and the plate-shape conductive member which reflects light corresponds to the portion of the second electrode 60 which reflects light (reflective surface).

When the peak wavelengths $\lambda_B$, $\lambda_G$, and $\lambda_R$ of light emitted from the blue light-emitting layer, the green light-emitting layer, and the red light-emitting layer are 460 nm, 520 nm, and 620 nm, respectively, the average refractive index n of the member placed between the k-th light-emitting layer and the second electrode is 1.6, and $m_k$ is 1 and 3, the resonance distances $d_k$ calculated by Equation (1) are shown in Table 1.

TABLE 1

| PEAK WAVELENGTH | RESONANCE DISTANCE $d_k$ (nm) | |
| --- | --- | --- |
| (nm) | $m_k = 1$ | $m_k = 3$ |
| $\lambda_B = 460$ | 72 | 216 |
| $\lambda_G = 520$ | 81 | 244 |
| $\lambda_R = 620$ | 97 | 291 |

In the k-th light-emitting layer counted from the first electrode side, a distance at which optical resonance is generated is theoretically calculated by Equation (1) as a resonance distance $d_k$. The resonance distances $d_k$ for specific peak wavelengths in light emitted from the red light-emitting layer, the green light-emitting layer, and the blue light-emitting layer are shown in Table 1. The effects of optical resonance are exerted not only at the resonance distance $d_k$ calculated by Equation (1), but also in the vicinity of the resonance distance. Therefore, it is preferable that the distance between the light-emitting center portion of the k-th light-emitting layer counted from the first electrode side and the portion of the second electrode which reflects light is adjusted to a distance 0.9 to 1.1 times, and more preferably 0.95 to 1.05 times the resonance distance $d_k$ theoretically calculated.

In the element of the first embodiment shown in FIG. 1, a distance $d_R$ between a light-emitting center portion of the red light-emitting layer 41 and the reflective surface 60a is set to a distance satisfying 0.9 to 1.1 times a resonance distance $d_1$. A distance $d_G$ between a light-emitting center portion of the green light-emitting layer 42 and the reflective surface 60a is set to a distance satisfying 0.9 to 1.1 times a resonance distance $d_2$. A distance $d_B$ between a light-emitting center portion of the blue light-emitting layer 43 and the reflective surface 60a is set to a distance satisfying 0.9 to 1.1 times a resonance distance $d_3$.

The distance $d_R$ between the light-emitting center portion of the red light-emitting layer 41 and the reflective surface 60a is set to a distance satisfying 0.9 to 1.1 times the resonance distance $d_1$; thus, optical resonance is generated by light emitted from the red light-emitting layer 41 toward the first electrode 20 and reflected light emitted toward the second electrode 60 and reflected by the reflective surface 60a to return, thereby enhancing the red light. Similarly, the distance $d_G$ between the light-emitting center portion of the green light-emitting layer 42 and the reflective surface 60a is set to a distance satisfying 0.9 to 1.1 times the resonance distance $d_2$; thus, optical resonance is generated by light emitted from the green light-emitting layer 42 toward the first electrode 20 and reflected light emitted toward the second electrode 60 and reflected by the reflective surface 60a to return, thereby enhancing green light. Similarly, the distance $d_B$ between the light-emitting center portion of the blue light-emitting layer 43 and the reflective surface 60a is set to a distance satisfying 0.9 to 1.1 times the resonance distance $d_3$; thus, optical resonance is generated by light emitted from the blue light-emitting layer 43 toward the first electrode 20 and reflected light emitted toward the second electrode 60 and reflected by the reflective surface 60a to return, thereby enhancing blue light.

An order of stacking the respective light-emitting layers is not particularly limited as long as the respective light-emitting layers are disposed at positions where optical resonance occurs. In the element of the first embodiment, it is preferable that the light-emitting layer which emits light having a longer peak wavelength among the plurality of light-emitting layers is disposed at a position closer to the first electrode between the first and second electrodes.

As shown in Equation (1), $m_k$ is a discrete number (positive odd number), and therefore a distance at which optical resonance is generated is also discretely obtained as shown in Table 1. The shorter the distance between the light-emitting layer and the second electrode is, the higher the optical interference effect is. The longer the distance between the light-emitting layer and the second electrode is, the larger attenuation in the reflected light is. Therefore, in consideration of the interference effect and the attenuation in light, it is preferable that the distance between the light-emitting layer and the second electrode is shorter. It is more preferable that the distance is set to the shortest distance among distances at which optical resonance is generated. Accordingly, it is further preferable that the distance between the light-emitting center portion of each light-emitting layer and the portion of the second electrode which reflects light is about a resonance distance $d_1$ when $m_k$ is 1. As seen from Equation (1), when $m_k$ is 1 is, the longer the wavelength $\lambda_k$ is, the longer the resonance distance $d_1$, and the shorter the wavelength $\lambda_k$ is, the shorter the resonance distance $d_1$ shorter (see Table 1).

In the element of the first embodiment, the light-emitting layer which emits light having a longer peak wavelength is disposed at a position closer to the first electrode among the plurality of light-emitting layers. This is because the respective light-emitting layers are disposed from the second electrode side according to the order that the resonance distance $d_1$ when $m_k$ is 1 is shorter. When the respective light-emitting layers are disposed in such an order, the respective light-emitting layers can be disposed so that the distance between the light-emitting center portion of each light-emitting layer and the portion of the second electrode which reflects light is about the resonance distance $d_1$ when $m_k$ is 1. Thus, the optical interference effect can be most effectively exerted.

In a multi-photon type organic EL element of which the configuration is different from that of the organic EL element of the present invention which is a single-photon type, a certain layer such as a charge generating layer is provided between the light-emitting layers. Generally, certain layers, such as a charge generating layer, a hole injection layer, and an electron injection layer, are provided. As seen from Table 1, when $m_k$ is 1, difference between the resonance distances $d_k$ of the red light-emitting layer, the green light-emitting layer, and the blue light-emitting layer is about 10 nm. Therefore, in the single-photon type element of the first embodiment, when any layer different from the light-emitting layer is not provided between the light-emitting layers, the thicknesses of light-emitting layers excepting one light-emitting layer need to be about 10 nm. When the multi-photon type organic EL element is configured under a condition of generating optical resonance when $m_k$ is 1, the thickness of a layered body in which the light-emitting layer, the charge generating layer, and the certain layer provided if necessary are stacked needs to be controlled to about 10 nm. However, it is difficult to precisely control the respective layers to such a thickness, and the production process would be sophisticated. Further, since the thickness of the light-emitting layer itself needs to become very thin by a thickness of the charge generating layer and the like, there is also a problem of decrease in light-emitting efficiency. On the other hand, in the organic EL element of the present invention which is a single-photon type, there is no problem as seen in the multi-photon type organic EL element. Further, the respective light-emitting layers are disposed so as to have about a resonance distance $d_1$ calculated by Equation (1) when $m_k$ is 1 as described above. Thus, the optical interference effect can be most effectively exerted.

The value of $m_k$ is set to a predetermined positive odd number depending on the light-emitting layer, and the number may be a common number in all the light-emitting layers or be different depending on the light-emitting layer. For example, $m_k$ of the red light-emitting layer may be 5, $m_k$ of the green light-emitting layer may be 3, and $m_k$ of the blue light-emitting layer may be 1. Alternatively, each $m_k$ of the red light-emitting layer, the green light-emitting layer, and blue light-emitting layer may be 1.

Like the element of the first embodiment, it is preferable that a light-emitting layer which emits light having a longer peak wavelength among the light-emitting layers is disposed at a position closer to the first electrode between the first and second electrodes, the first electrode 20 is an anode, and the second electrode 60 is a cathode. In this case, the light-emitting layer which emits light having a longer peak wavelength is disposed at a position closer to the anode (the first electrode 20 in the first embodiment). When the light-emitting layers are disposed in such a stacking order, an organic EL element in which color is changed little in response to the variation of the voltage applied to the electrodes and which has high light-emitting efficiency can be realized.

The longer peak wavelength the light emitted from a compound constituting a light-emitting layer has, the lower the highest occupied molecular orbital (HOMO) and the lowest unoccupied molecular orbital (LUMO) of the compound constituting the light-emitting layer tend to be. In the element of the first embodiment, the respective light-emitting layers 41, 42, and 43 which emit light having a longer peak wavelength are disposed at a position closer to the anode. As a result, the light-emitting layer formed from a compound having lower HOMO and LUMO is disposed at a position closer to the anode. Thus, since the respective light-emitting layers 41, 42, and 43 are disposed from the anode to the cathode in an order of increasing HOMO and LUMO, holes and electrons injected from the anode side and cathode, respectively, can be transported effectively in the element. Therefore, it is assumed that the organic EL element in which color is changed little in response to the variation of the voltage applied to the electrodes and which has high light-emitting efficiency can be realized.

When the light-emitting layers are stacked in such a stacking order, the range of variation of coordinate value x and the range of variation of coordinate value y in a chromaticity coordinate of light emitted outside by changing the voltage applied between the anode and the cathode can be each controlled to 0.05 or smaller. The range of applied voltage when the voltage to be applied varies is usually a range in which luminance is 100 cd/m$^2$ to 10000 cd/m$^2$, and at least 4000 cd/m$^2$ to 6000 cd/m$^2$. Further, the light emitted outside refers to light made by mixing lights emitted from the light-emitting layers 41, 42, and 43. The regulation of chromaticity coordinate used herein follows CIE1931 as determined by the International Commission on Illumination (CIE).

It is preferable that the thickness of the respective light-emitting layers constituting the light-emitting layer is thinner when the light-emitting layer is disposed at a position closer to the anode. Accordingly, in the case of element of the first embodiment, it is preferable that the green light-emitting layer 42 is thicker than the red light-emitting layer 41 and the blue light-emitting layer 43 is thicker than the green light-emitting layer 42. Specifically, the thickness of the red light-emitting layer 41 is preferably 5 nm to 20 nm, and more preferably 10 nm to 15 nm. Further, the thickness of the green light-emitting layer 42 is preferably 5 nm to 30 nm, and more preferably 15 nm to 25 nm. Moreover, the thickness of the blue light-emitting layer 43 is preferably 5 nm to 100 nm, and more preferably 50 nm to 65 nm. When the thicknesses of the light-emitting layers 41, 42, and 43 are set as described above, an organic EL element in which color is changed little in response to the variation of the voltage applied to the electrodes and which has high light-emitting efficiency can be realized.

As described above, certain layers other than the light-emitting layers, if necessary, may be provided between the first and second electrodes. Examples of the certain layers may include a hole injection layer, a hole transport layer, an electron injection layer, and an electron transport layer. The distance between the light-emitting center portion in the light-emitting layer and the portion of the second electrode which reflects light can be adjusted by controlling the thickness of the light-emitting layer. However, the distance between the light-emitting layer and the second electrode may be adjusted not only by controlling the thickness of the light-emitting layer but also by controlling the thickness of a certain layer placed between the light-emitting layer and the second electrode.

In the element of the first embodiment shown in FIG. 1, an electron injection layer 50 is placed between each of the light-emitting layers 41, 42, and 43 and the reflective surface 60a. Thus, the thickness of the electron injection layer 50, in addition of thicknesses of the light-emitting layers 41, 42, and 43, is controlled, and therefore the light-emitting layers 41, 42, and 43 can be disposed at respective positions so that optical resonance is generated.

Figure 2:
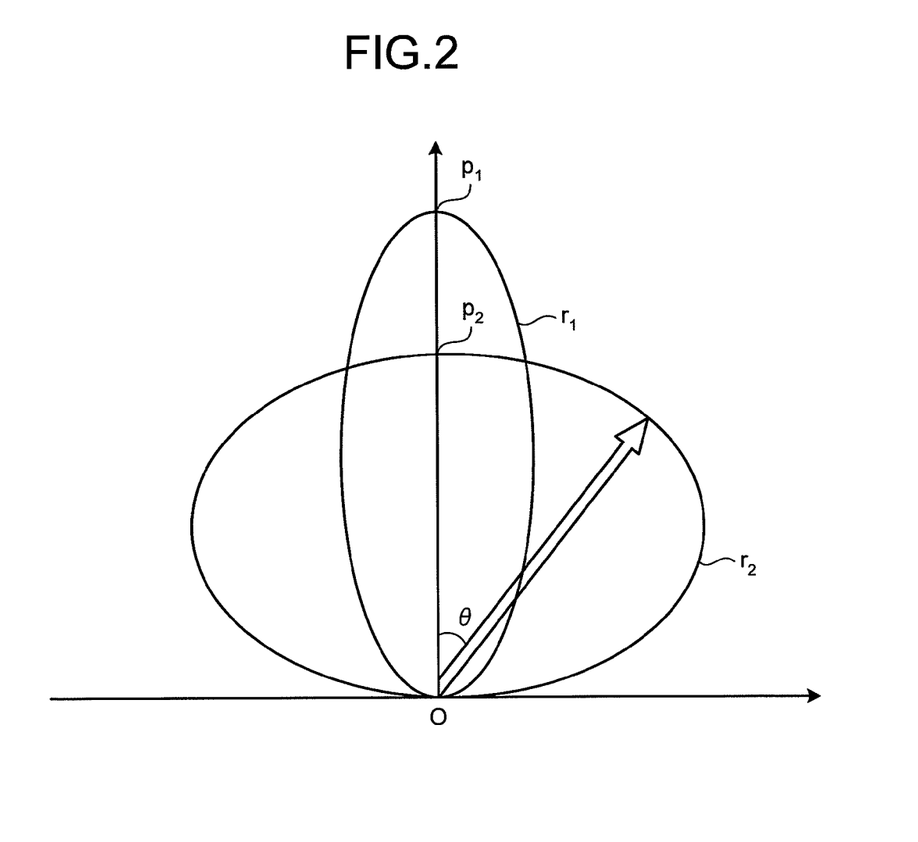
FIG. 2 is a diagram representing intensity distribution of light emitted from an organic EL element in a polar coordinate.

When the light-emitting layers are disposed at respective predetermined positions as described above, optical resonance in light emitted from each of the light-emitting layers can be generated according to each of the light-emitting layers. FIG. 2 is a view showing the intensity distribution of light emitted from an organic EL element in a polar coordinate. FIG. 2 shows comparison of two kinds of intensity distributions. One intensity distribution is that of the light emitted from an organic EL element which generates optical resonance. Another intensity distribution is that of the light emitted from an organic EL element which does not generate optical resonance. In FIG. 2, the intensity distribution of the light emitted from an organic EL element which generates optical resonance is represented by a line $r_1$ of a substantially elliptical shape elongated in a vertical axis direction. The intensity distribution of the light emitted from an organic EL element which does not generate optical resonance is represented by a line $r_2$ of a substantially elliptical shape elongated in a horizontal direction.

When an intersection of a vertical axis and a horizontal axis is defined as the origin "O", an angle θ between a straight line connecting the origin O with a given point and the vertical axis corresponds to a travelling direction of light emitted in a direction which is inclined at the angle θ to a normal direction of a principal surface of the first electrode, and a distance between the origin O and the given point corresponds to optical intensity. Accordingly, when a gradient of a straight line connecting the origin O with given points on the substantially elliptical shape lines $r_1$ and $r_2$ is defined as θ in FIG. 2, the lengths of the straight lines connecting the origin O with the given points on the lines $r_1$ and $r_2$ represent an intensity of light emitted in θ direction. For example, values of intersections $p_1$ and $p_2$ of the substantially elliptical shape lines $r_1$ and $r_2$ and the vertical axis each represent an intensity of light emitted in the front direction since θ is "0."

Since optical resonance is generated by resonating reflected light emitted toward the second electrode and then reflected by the second electrode and light emitted toward the first electrode, light emitted toward the front direction is mainly enhanced. On the contrary, since optical resonance effect is unlikely to be exerted in a direction which deviates from the front direction (direction in which θ is close to 90°), light is not enhanced by reflected light in a direction which deviates from the front direction as compared with the case in the front direction. Therefore, as shown in FIG. 2, the light emitted from an organic EL element which generates optical resonance becomes the substantially elliptical shape elongated in the vertical axis direction, and the intensity of the light emitted toward the front direction is enhanced. On the other hand, in the light emitted from an organic EL element which does not generate optical resonance, the intensity of the light emitted toward the front direction generated by optical resonance is not particularly enhanced, and therefore light is emitted over a wide range. Therefore, when optical resonance is generated, light-emitting intensity toward the front direction can be particularly enhanced to narrow a range in which light is emitted.

In an organic EL element using optical resonance, not only a range in which light is emitted but also spectral width of emitted light can be narrowed. As seen from Equation (1), optical resonance is generated in light having a specific wavelength. Since light having a wavelength which does not satisfy the resonance condition is not enhanced by resonance, light having a specific wavelength which generates optical resonance is particularly enhanced. As a result, spectrum band is narrowed. In the element of the first embodiment, the spectrum band in each light-emitting layer is thus narrowed.

Figure 3:
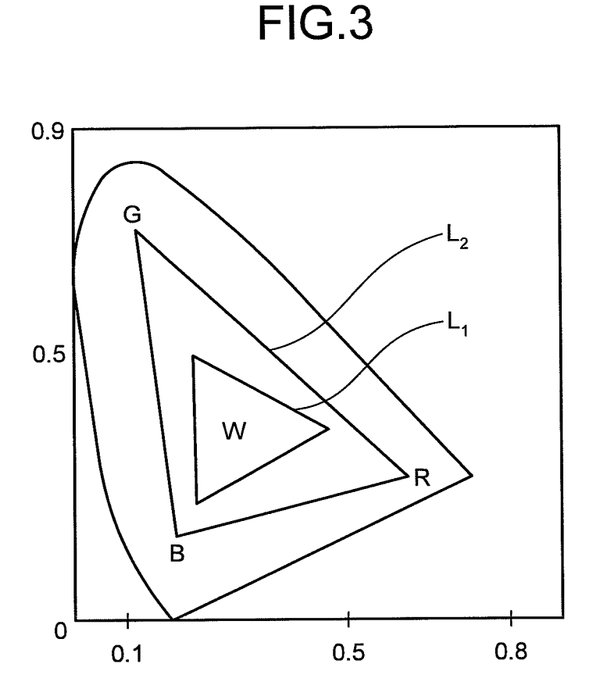
FIG. 3 is a diagram representing color of light emitted from each light-emitting layer of the organic EL element in a color coordinate.

FIG. 3 is a diagram representing color of light emitted from each light-emitting layer of the organic EL element in a color coordinate. FIG. 3 shows comparison of two kinds of colors of light. One color of light is the color of the light emitted from an organic EL element which generates optical resonance. Another color of light is the color of the light emitted from an organic EL element which does not generate optical resonance. In FIG. 3, the light emitted from an organic EL element which generates optical resonance is represented by a large triangle $L_2$ and the light emitted from an organic EL element which does not generate optical resonance is represented by a small triangle $L_1$. In addition, FIG. 3 shows a spectrum locus t1 which is a horseshoe-shape curve and a straight purple boundary t2 which connects both ends of the spectrum locus t1. The vertices R, G, and B of the triangle represent colors of light emitted from the red light-emitting layer, the green light-emitting layer, and the blue light-emitting layer, respectively. The light emitted from the organic EL element is light made by mixing each light emitted from the red light-emitting layer, the green light-emitting layer, and the blue light-emitting layer. Therefore, when the intensities of each light emitted from the respective light-emitting layers are appropriately adjusted and colors are added or mixed at a certain proportion, an organic EL element which emits light of a certain color within an region surrounded by the triangle can be realized. Accordingly, the wider the triangle shown in FIG. 3 is, the wider the selection of color of light which can be emitted from the organic EL element is.

As described above, occurrence of optical resonance narrows a spectrum band. The spectrum locus t1 in the color coordinate represents color in which the spectral width is 0. When the spectrum band is narrowed by optical resonance (that is, when the spectral width is close to 0), the vertices which represent colors of light emitted from the red light-emitting layer, the green light-emitting layer, and the blue light-emitting layer are each shifted to the side of the spectrum locus t1. Therefore, the triangle $L_2$ which represents color of light emitted from an organic EL element which generates optical resonance is spread closer to the spectrum locus t1 in the color coordinate with respect to the small triangle $L_1$ which represents color of light emitted from an organic EL element which does not generate optical resonance. Thus, the use of the organic EL element which generates optical resonance can widen the triangle $L_2$ which represents color of the light emitted from the respective light-emitting layers in the color coordinate, and therefore the range of selection of color of light which can be emitted is broadened. Accordingly, the range of color which can be reproduced is broadened.

Further, when the organic EL element and a color filter are used in combination, narrowing of the spectrum band by optical resonance can decrease a proportion of light which does not penetrate the color filter, for example, a proportion of light corresponding to a tail part of a spectral curve (envelope). Thus, a loss of light by use of the color filter can be decreased, and utilization efficiency of light emitted from the element can be improved.

The peak wavelength of light emitted from the light-emitting layer as used in this description refers to a wavelength in which the optical intensity is the highest when the emitted light is observed in terms of a wavelength area. For the red light-emitting layer 41, light having a peak wavelength of 580 nm to 660 nm, and preferably 600 nm to 640 nm may be used. For the green light-emitting layer 42, light having a peak wavelength of 500 nm to 560 nm, and preferably 520 nm to 540 nm may be used. Further, for the blue light-emitting layer 43, light having a peak wavelength of 400 nm to 500 nm, and preferably 420 nm to 480 nm may be used. Each light which has such a peak wavelength and is emitted from each of three light-emitting layers 41, 42, and 43 is mixed with the others to produce white light. Therefore, the red light-emitting layer 41, the green light-emitting layer 42, and the blue light-emitting layer 43 are provided to realize the element of the first embodiment which emits white light.

The light-emitting layers each contain an organic compound which emits fluorescence and/or phosphorescence (hereinafter may be referred to as a light-emitting organic compound) as a main component. The light-emitting organic compound is divided into a low molecular compound and a macromolecular compound, and a light-emitting macromolecular organic compound suitable for a coating method is preferable. In addition to the light-emitting organic compound, a metal complex-based light-emitting material and the like may be added to the light-emitting layer, and an inorganic material may be added. As used in the description, a macromolecule is a compound having a polystyrene equivalent number average molecular weight of $10^3$ or higher. With regard to the present invention, there is no particular reason to set the number average molecular weight of a macromolecule to a certain upper limit, but the upper limit of the number average molecular weight of the macromolecule is usually $10^8$ or lower as the polystyrene equivalent number molecular weight. Moreover, the light-emitting layer may contain an arbitrary component such as a dopant. For example, the dopant is added for purposes such as improving the light-emitting efficiency and changing light-emitting wavelength. Examples of the light-emitting material mainly constituting the respective light-emitting layers may include as follows.

Examples of the pigment light-emitting material may include compounds obtained by polymerizing a cyclopendamine derivative, a tetraphenylbutadiene derivative compound, a triphenylamine derivative, an oxadiazole derivative, a pyrazoloquinoline derivative, a distyrylbenzene derivative, a distyrylarylene derivative, a pyrrole derivative, a thiophene cyclic compound, a pyridine cyclic compound, a perinone derivative, a perylene derivative, an oligothiophene derivative, an oxadiazole dimer, a quinacridone derivative, a coumalin derivative, or a pyrazoline dimer.

Examples of the metal complex-based light-emitting material may include compounds obtained by polymerizing a metal complex having, as a central metal, rare earth metal such as Tb, Eu, or Dy; metal such as Al, Zn, Be, or Ir, and, as a ligand, oxadiazole, thiadiazole, phenylpyridine, phenylbenzimidazole, or quinoline structure. Specific examples thereof may include compounds obtained by polymerizing a metal complex which emits light from a triplet excited state such as an iridium complex, or a platinum complex, an aluminum quinolinol complex, a benzoquinolinol beryllium complex, a benzoxazolyl zinc complex, a benzothiazole zinc complex, an azomethyl zinc complex, a porphyrin zinc complex, or an europium complex.

Examples of the macromolecular light-emitting material may include poly(para-phenylene vinylene) derivatives, polythiophene derivatives, poly(para-phenylene) derivatives, polysilane derivatives, polyacetylene derivatives, polyfluorene derivatives, and polyvinyl carbazole derivatives.

Among the above-described light-emitting materials, examples of the light-emitting material constituting a red light-emitting layer may include coumarin derivatives, and thiophene cyclic compounds, and polymers thereof, poly (para-phenylene vinylene) derivatives, polythiophene derivatives, and polyfluorene derivatives. Among them, poly(para-phenylene vinylene) derivatives, polythiophene derivatives, polyfluorene derivatives, which are the macromolecular materials, and the like are preferable.

Among the above-described light-emitting materials, examples of the light-emitting material constituting a green light-emitting layer may include quinacridone derivatives, coumarin derivatives, and thiophene cyclic compounds, and polymers thereof; poly(para-phenylene vinylene) derivatives, and polyfluorene derivatives. In particular, poly(para-phenylene vinylene) derivatives, polyfluorene derivatives, and the like, which are the macromolecular materials, are preferable.

Among the above-described light-emitting materials, examples of the light-emitting material constituting a blue light-emitting layer may include polymers of a distyrylarylene derivative and/or an oxadiazole derivative, polyvinyl carbazole derivatives, poly(para-phenylene) derivatives, and polyfluorene derivatives. In particular, polyvinyl carbazole derivatives, poly(para-phenylene) derivatives, polyfluorene derivatives, which are the polymeric materials, and the like are preferable.

For example, the light-emitting material constituting the respective light-emitting layers may include further a dopant material, in addition to the above-described light-emitting materials, for purposes such as improving the light-emitting efficiency and changing a light-emitting wavelength. Examples of such a dopant material may include perylene derivatives, coumarin derivatives, rubrene derivatives, quinacridone derivatives, squalium derivatives, porphyrin derivatives, styryl pigments, tetracene derivatives, pyrazolone derivatives, decacyclene, and phenoxazone.

The element of the first embodiment includes three light-emitting layers 41, 42, and 43 as described above, and therefore can emit light having certain color within the triangle $L_2$ shown in FIG. 3. However, the present invention can be applied not only to an organic EL element having three light-emitting layers but also to an organic EL element having two or four or more light-emitting layers.

B. First Electrode

For the first electrode, a conductive member having optical transparency is used. The first electrode is provided as an anode or a cathode. In the element of the first embodiment, the first electrode 20 is provided on the supporting substrate 10 as an anode.

The first electrode is formed from a thin film of, for example, a metal oxide, a metal sulfide, metal, or the like, and a suitable material is appropriately selected depending on an anode or a cathode. For example, when the first electrode is provided as an anode, a thin film made of indium oxide, zinc oxide, tin oxide, ITO, indium zinc oxide (IZO), gold, platinum, silver, copper, or the like is preferably used as the anode. Further, an organic conductive thin film made of polyaniline or a derivative thereof, polythiophene or a derivative thereof, or the like, may be used as the anode. For example, when the first electrode is provided as a cathode, a thin film made of a material which has a low work function, facilitates injection of electrons into a light-emitting layer, and has a high electrical conductivity is preferably used as the cathode. For example, a thin film made of an alkali metal, an alkaline earth metal, a transition metal, a group 13 metal in the periodic table, or the like is preferably used. In consideration of light transmittance and electrical resistance, the thickness of the first electrode is appropriately set. For example, the thickness of the first electrode is set to such a thickness that a certain proportion of light can penetrate.

C. Second Electrode

For the second electrode, a conductive member having an optical characteristic of reflecting incident light toward the first electrode is used. The second electrode is provided as an anode or a cathode. The polarity of the second electrode is different from that of the first electrode. In the element of the first embodiment, the second electrode 60 is stacked on the electron injection layer 50 as a cathode. The second electrode may be configured using a material which is appropriately selected from the materials shown as examples of the first electrode according to its polarity. For example, an electrode which reflects light may be formed by increasing the thickness of the electrode. For example, by stacking a conductive thin film having high conductivity and reflecting light, which is made of Al, Au, or Ag, and a conductive thin film having optical transparency (for example, ITO thin film), the electrode which reflects light on an interface of both the thin films may be formed. When the second electrode is configured to stack a conductive thin film which reflects light and a conductive thin film which light penetrates, the conductive thin film which light penetrates is usually disposed at a position closer to the first electrode.

The reflectivity of the second electrode with light emitted from the light-emitting layer toward the second electrode is usually 50% or higher, preferably 80% or higher, and more preferably 90% or higher.

D. Certain Layers

As described above, certain layers different from the light-emitting layers, if necessary, may be provided between a pair of electrodes in the organic EL element. Examples of the certain layers may include a hole injection layer, a hole transport layer, a hole block layer, an electron injection layer, an electron transport layer, and an electron block layer. The element of the first embodiment shown in FIG. 1 includes the hole injection layer 30 and the electron injection layer 50 as the certain layer.

Examples of the layer, if necessary, provided between an anode and a light-emitting layered body configured to stack a plurality of light-emitting layers may include layers such as a hole injection layer, a hole transport layer, and an electron block layer. In the element of the first embodiment shown in FIG. 1, the hole injection layer 30 is provided between the first electrode (anode) 20 and the light-emitting layered body 40. When a hole injection layer and a hole transport layer are provided between the anode and the light-emitting layered body 40, one layer disposed at a position closer to the anode is referred to as a hole injection layer, and another layer disposed at a position closer to the light-emitting layered body 40 is referred to as a hole transport layer.

Examples of the layer provided between the cathode and the light-emitting layered body may include an electron injection layer, an electron transport layer, and a hole block layer. In the element of the first embodiment shown in FIG. 1, the electron injection layer 50 is provided between the second electrode (cathode) 60 and the light-emitting layered body 40. When an electron injection layer and an electron transport layer are provided between the cathode and the light-emitting layered body, one layer disposed at a position closer to the cathode is referred to as an electron injection layer, and another layer disposed at a position closer to the light-emitting layered body is referred to as an electron transport layer.

<D1. Substrate>

A supporting substrate is a plate substrate, on which one or more organic EL elements are mounted. The supporting substrate may be a rigid substrate or a flexible substrate. For example, glass, plastic, macromolecular film, silicon board, metal board, or a substrate in which they are stacked are used for the supporting substrate. In the element of the first embodiment, since light is emitted toward the supporting substrate 10, the supporting substrate 10 is composed of a member having optical transparency.

Further, a sealing substrate (not shown) with which the organic EL element is covered to seal the element is usually provided on the supporting substrate. As the sealing substrate, the same materials as exemplified in the description of the supporting substrate may be used.

<D2. Hole Injection Layer>

A hole injection layer is a layer having a function of improving hole injection efficiency from an anode. Examples of the hole injection material constituting a hole injection layer may include: phenylamines; starburst amines; phthalocyanines; oxides such as vanadium oxide, molybdenum oxide, ruthenium oxide, and aluminum oxide; amorphous carbon; polyaniline; and polythiophene derivatives.

In consideration of various required characteristics, film formation properties and the like, the thickness of the hole injection layer is appropriately set, and the thickness thereof is 1 nm to 10 μm, preferably 2 nm to 500 nm, and further preferably 5 nm to 200 nm.

<D3. Hole Transport Layer> (Not Shown)

A hole transport layer is a layer having a function of improving hole injection of one or more layers selected from an anode, a hole injection layer, and a hole transport layer which is closer to the anode.

Examples of the hole transport material constituting a hole transport layer may include polyvinyl carbazole and derivatives thereof, polysilane and derivatives thereof, polysiloxane derivatives having an aromatic amine in a side chain or a main chain, pyrazoline derivatives, arylamine derivatives, stilbene derivatives, triphenyldiamine derivatives, polyaniline and derivatives thereof, polythiophene and derivatives thereof, polyarylamine and derivatives thereof, polypyrrole and derivatives thereof, poly(p-phenylene vinylene) and derivatives thereof, and poly(2,5-thienylene vinylene) and derivatives thereof.

Among these hole transport materials, macromolecular hole transport materials such as polyvinyl carbazole and derivatives thereof, polysilane and derivatives thereof, polysiloxane derivatives having an aromatic amine in a side chain or a main chain, polyaniline and derivatives thereof, polythiophene and derivatives thereof, polyarylamine and derivatives thereof, poly(p-phenylene vinylene) and derivatives thereof, and poly(2,5-thienylene vinylene) and derivatives thereof are preferable, and more preferable are polyvinyl carbazole and derivatives thereof, polysilane and derivatives thereof, and polysiloxane derivatives having an aromatic amine in a side chain or a main chain and the like.

If the hole transport material is a low molecule material, it is preferable that a low molecular hole transport material be dispersed in a macromolecular binder for use.

In consideration of various needed characteristics, film formation properties and the like, the thickness of the hole transport layer is appropriately set, and the thickness thereof is 1 nm to 1 μm, preferably 2 nm to 500 nm, and further preferably 5 nm to 200 nm.

<D4. Electron Block Layer> (Not Shown in Figures)

An electron block layer is a layer having a function of interrupting transport of electrons. The hole injection layer or the hole transport layer may also serve as the electron block layer. For the electron block layer, various materials exemplified as the materials for the hole injection layer or the hole transport layer may be used.

<D5. Electron Injection Layer>

An electron injection layer is a layer having a function of improving electron injection efficiency from a cathode.

An electron injection material constituting an electron injection layer is appropriately selected depending on a kind of a light-emitting layer, a kind of a cathode, or the like. Examples of the material constituting an electron injection layer may include alkali metal, alkaline earth metal, alloys containing one or more kinds of the metal, and oxides, halides, and carbonates of the metal, and mixtures of the above-described substances. Examples of the alkali metal, oxides thereof, halides thereof, and carbonates thereof may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of the alkaline earth metal, and oxides thereof, halides thereof, and carbonates thereof may include magnesium, calcium, barium, strontium, magnesium oxide, magnesium fluoride, calcium oxide, calcium fluoride, barium oxide, barium fluoride, strontium oxide, strontium fluoride, and magnesium carbonate.

The electron injection layer may be a layered body in which two or more layers are stacked. Specific examples of the layered body may include LiF/Ca. It is preferable that the thickness of the electron injection layer is about 1 nm to about 1 μm.

<D6. Electron Transport Layer> (Not Shown in Figures)

Examples of the electron transport material constituting an electron transport layer may include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline or derivatives thereof, polyquinoline and derivatives thereof, polyquinoxaline and derivatives thereof, and polyfluorene and derivatives thereof.

In consideration of various needed characteristics, film formation properties and the like, the thickness of the electron transport layer is appropriately set, and the thickness thereof is 1 nm to 1 μm, preferably 2 nm to 500 nm, and further preferably 5 nm to 200 nm.

<D7. Other Certain Constitution Layers>

Further, the other certain layer, such as an insulating layer which is adjacent to the electrode and has a thickness of 2 nm or less, may be provided for purposes such as increasing the adhesion to an electrode, and improving the injection of charge from the electrode. As the further certain layer, for example, a thin buffer layer may be inserted between the layers in order to increase the adhesion at the interface and prevent mixing of the interface.

E. Layer Configuration of Organic EL Element

As described above, there are organic EL elements having various layer configurations as embodiments.

Specific examples thereof are shown below.

(a) Anode/light-emitting layered body/cathode
(b) Anode/hole injection layer/light-emitting layered body/cathode
(c) Anode/light-emitting layered body/electron injection layer/cathode
(d) Anode/hole injection layer/light-emitting layered body/electron injection layer/cathode
(e) Anode/hole injection layer/hole transport layer/light-emitting layered body/cathode
(f) Anode/light-emitting layered body/electron transport layer/electron injection layer/cathode (g) Anode/hole injection layer/hole transport layer/light-emitting layered body/electron injection layer/cathode
(h) Anode/hole injection layer/light-emitting layered body/electron transport layer/electron injection layer/cathode
(i) Anode/hole injection layer/hole transport layer/light-emitting layered body/electron transport layer/electron injection layer/cathode
(Here, the symbol "/" indicates that two layers in which the symbol "/" is inserted are stacked adjacent to each other. Hereinafter the same symbol represents the same meaning.)

As described above, the light-emitting layered body may be configured only by a plurality of light-emitting layers, or include a certain layer placed between the light-emitting layers.

F. Other Embodiments

The element of the first embodiment is a so-called bottom emission type element in which light is emitted from the supporting substrate 10 side, and is provided with the first electrode having optical transparency disposed at a position closer to the supporting substrate 10 as an anode. Examples of the other embodiment may include the following configurations in consideration of a direction of emitting light and polarity of the electrodes.
(j) Top Emission Type
Supporting substrate/second electrode (anode)/hole injection layer/light-emitting layered body/electron injection layer/first electrode (cathode)
(k) Bottom Emission Type
Supporting substrate/first electrode (cathode)/electron injection layer/light-emitting layered body/hole injection layer/second electrode (anode)
(l) Top Emission Type
Supporting substrate/second electrode (cathode)/electron injection layer/light-emitting layered body/hole injection layer/first electrode (anode)

The embodiments in the above (j) to (l) show that an organic EL element comprises an anode, a hole injection layer, a light-emitting layered body, an electron injection layer, and a cathode. However, a layer configuration between the cathode and the anode is not limited to (j) to (l), and any layer configuration such as (a) to (i) may be employed.

<2. Method of Producing the Organic EL Element of the Present Invention>

The organic EL element of the present invention may be produced by stacking respective members constituting an element successively on a supporting substrate. There are various methods for forming a layer. From these methods, a suitable formation method may be appropriately selected, for example, depending on materials for a layer to be formed, properties of a layer to become a foundation.

G. Method of Forming Light-Emitting Layered Body

The organic EL element of the present invention is provided with a plurality of light-emitting layers. The stacking order of the light-emitting layers is not particularly limited, and it is preferable that they are disposed in the above-described orders with respect to a first electrode depending on the peak wavelength of light emitted from the respective light-emitting layers.

The respective light-emitting layers are deposited, for example, by applying a coating solution in which a material constituting the light-emitting layer is dissolved in a solvent to form a film and then solidifying the film. The solvent is not limited as long as a material constituting a light-emitting layer is dissolved in the solvent. Examples of the solvent may include water, chlorinated solvents such as chloroform, methylene chloride, and dichloroethane, ether solvents such as tetrahydrofuran, aromatic hydrocarbon solvents such as toluene and xylene, ketone solvents such as acetone and methyl ethyl ketone, and ester solvents such as ethyl acetate, butyl acetate, and ethyl cellosolve acetate.

Examples of the coating method of forming a film of the light-emitting layer may include a spin coating method, a casting method, a microgravure coating method, a gravure coating method, a bar coating method, a roll coating method, a wire bar coating method, a dip coating method, a spray coating method, a screen printing method, a flexography method, an offset printing method, and an inkjet printing method. The coating solution is applied using these coating method to form a film and the film is solidified to form each light-emitting layer.

When a light-emitting layer is further formed on the light-emitting layer having been formed, the light-emitting layer having been formed is possibly dissolved in a coating solution of the light-emitting layer to be further formed. Therefore, it is preferable that the light-emitting layer having been formed be insolubilized in the coating solution in advance. For example, the light-emitting layer may be insolubilized by applying a coating solution containing a polymerizable compound to the light-emitting layer to form a film, and then carrying out a treatment such as light irradiation and heating to polymerize the polymerizable compound. Further, a polymerizable compound may be used for a light-emitting material, or a polymerizable compound may be added to a coating solution in addition to the light-emitting material.

H. Method of Forming First and Second Electrodes

Examples of the method of producing an anode may include vacuum deposition method, sputtering method, CVD method, ion plating method, laser ablation method, lamination method for pressure-bonding a metal thin film, and metal plating method.

I. Method of Forming Certain Layer

As described above, the organic EL element is further provided with a certain layer different from the light-emitting layer, if necessary. There are various method of forming the certain layer. From these methods, a suitable formation method can be appropriately selected, for example, depending on materials for a layer to be formed, properties of a layer to become a foundation, or the like. Hereinafter, the embodiment of method of forming these layer will be shown.

The method of forming a hole injection layer may be a coating method, for example, in which a coating solution in which the above-described hole injection material is dissolved in a solvent and applied to form a film. The solvent is not limited as long as the hole injection material is dissolved in the solvent. Examples of the solvent may include water, chlorinated solvents such as chloroform, methylene chloride, and dichloroethane, ether solvents such as tetrahydrofuran, aromatic hydrocarbon solvents such as toluene and xylene, ketone solvents such as acetone and methyl ethyl ketone, and ester solvents such as ethyl acetate, butyl acetate, and ethyl cellosolve acetate.

Examples of the coating method of forming a film of the hole injection layer may include a spin coating method, a casting method, a microgravure coating method, a gravure coating method, a bar coating method, a roll coating method, a wire bar coating method, a dip coating method, a spray coating method, a screen printing method, a flexography method, an offset printing method, and an inkjet printing method. The coating solution is applied, by one method from these coating methods, to the supporting substrate in which an anode has been formed to form a hole injection layer.

Examples of forming a film of a hole transport layer may include: in the case of a low molecular hole transport material, a method of forming a film from a mixed solution of the material and a macromolecular binder; and in the case of a macromolecular hole transport material, a coating method of forming a film from a solution of the material.

A solvent used in the film formation from the solution is not limited as long as the hole transport material is dissolved in the solvent. Examples of the solvent may include chlorinated solvents such as chloroform, methylene chloride, and dichloroethane, ether solvents such as tetrahydrofuran, aromatic hydrocarbon solvents such as toluene and xylene, ketone solvents such as acetone and methyl ethyl ketone, and ester solvents such as ethyl acetate, butyl acetate, and ethyl cellosolve acetate. Examples of the method of forming a film from the solution may include the same coating methods as exemplified as the method of forming a film of a hole injection layer.

It is preferable that the macromolecular binder to be mixed be one which does not extremely hinder the charge transport. A macromolecular binder having low absorption of visible light can be preferably used. Examples of the macromolecular binder may include polycarbonate, polyacrylate, polymethylacrylate, polymethylmethacrylate, polystyrene, polyvinylchloride, and polysiloxane.

Examples of the method of forming a film of an electron injection layer may include a coating method such as printing method, deposition method, and sputtering method.

Examples of the method of forming a film of an electron transport layer may include: in the case of the low molecular electron transport material, a vacuum deposition method from a powder, and a method of forming a film from a solution or a molten state of the material; and in the case of a macromolecular electron transport material, a method of forming a film from a solution or a molten state of the material. In the method of forming a film from a solution or a molten state of the material, a macromolecular binder may be used in combination. Examples of the method of forming a film of an electron transport layer from the solution may include the same film formation methods as exemplified as the method of forming a film of a hole transport layer from the solution.

According to a preferable embodiment of the method of producing the organic EL element of the present invention, a certain layer provided between the light-emitting layers if necessary, and a plurality of light-emitting layers are all formed by the coating method. According to a more preferable embodiment, all layers provided between the first and second electrodes are each formed by the coating method. When a plurality of light-emitting layers are each stacked directly without a certain layer placed therebetween, all the light-emitting layers may be preferably formed by the coating method.

The multi-photon type organic EL element is provided with a plurality of light-emitting layers similarly to the single-photon type organic EL element of the present invention. In the case of the multi-photon type organic EL element, a member referred to as a charge generating layer or an intermediate unit is provided between the light-emitting layers as described above. Further, in the multi-photon type organic EL element, a layer such as a hole injection layer and an electron injection layer is usually provided in each of light-emitting units, and therefore the configuration of the multi-photon type element is complicated as compared with the single-photon type element, and the number of production process is increased. Further, a vacuum process is usually required in the formation of the charge generating layer and the like. On the other hand, the coating method is easier in the process than a method such as a vacuum deposition method which needs a vacuum process, but is unsuitable for film formation by coating in vacuum. Therefore, if the light-emitting layers are formed by the coating method in the production of the multi-photon type organic EL element, a process for forming a light-emitting layer under atmospheric pressure and a vacuum process for forming a layer such as a charge generating layer are alternately required. Even when the coating method which is easy in terms of the process is applied to the formation of the light-emitting layer, it is difficult to simplify the production process. On the other hand, in the single-photon type organic EL element of the present invention, the vacuum process for forming a charge generating layer is not required during the process for forming a plurality of light-emitting layer. Therefore, the production process can be simplified. In particular, all layers provided between the electrodes are formed by the coating method, and therefore an organic EL element can be easily produced.

Further, in the multi-photon type organic EL element, when the charge generating layer and the like are formed, the light-emitting layer which has been formed before the formation of the charge generating layer is possibly damaged. However, in the single-photon type organic EL element, the charge generating layer and the like is not required, and therefore damage of the light-emitting layer caused in the production process can be suppressed.

<3. Device Provided with Organic EL Element>

A light-emitting device of the present invention is provided with one or more organic EL elements described above. For example, the light-emitting device is used in a light source of a scanner; a surface light source used as a backlight of a liquid crystal display; a lighting device; and a display device. The light-emitting device is provided with an organic EL element having the above-described characteristics, and therefore is preferably used as a white lighting device, a monochrome display device, a full-color display device, or the like.

In addition, the light-emitting device may be further provided with a light-scattering layer and a color filter at a position where light emitted from the organic EL element passes. The light-scattering layer and the color filter are, for example, provided on an interface of air. Further, in the light-emitting device, a so-called TFT substrate in which a transistor element driving an organic EL element is formed may be used as a supporting substrate. That is to say, the light-emitting device may be used, for example, to form an active matrix type display device.

<3.1. White Lighting Device>

A white lighting device is configured using the organic EL element of the present invention, and therefore light-emitting efficiency can be further improved. Further, in the organic EL element of the present invention, since intensity of light emitted toward a front direction is increased, a lighting device which particularly lightens the front direction can be realized using the organic EL element of the present invention. For example, the organic EL element is combined with a light-scattering layer and a lens to improve light producing efficiency, and therefore a diffuse lighting device having high light-emitting efficiency can be made.

<3.2. Monochrome Display Device>

A monochrome display device provided with the organic EL element of the present invention can enhance an outgoing rate of all light of three colors to the front direction. For this reason, the monochrome display device can obtain a predetermined luminance at a lower current among devices including a single-photon type organic EL element, and as a result, a display device which has high light-emitting efficiency and decreases power consumption can be realized.

<3.3. Full-Color Display Device>

A full-color display device of the present invention is provided with the organic EL element of the present invention, and a color filter disposed at such a position that the light emitted from the organic EL element passes. In the full-color display device of the present invention, a plurality of pixels are formed by the organic EL element of the present invention, and the color filter is disposed at a light outgoing side. Since the organic EL element of the present invention is adjusted so that light emitted from each of the respective light-emitting layers generates optical resonance as described above, each spectral width is narrow and high intensity can be obtained with respect to each of red light, green light, and blue light. Further, when the organic EL element of the present invention is used in a display device that can achieve full color display by white light and the color filter in combination, a proportion of light which does not penetrate the color filter, for example, a proportion of light corresponding to a tail part of a spectral curve can be decreased. Thus, a loss of light by use of the color filter can be decreased. For this reason, although the full-color display device of the present invention is a display device using a single-photon type organic EL element with a simple structure as a light-emitting element, a full-color display device having high luminance can be realized.

As described above, effects of optical resonance can be obtained in light emitted from each of the light-emitting layers of the organic EL element of the present invention, and the spectrum band is narrowed. Therefore, as seen from the color coordinate of light emitted from the light-emitting layer as described above, the region of color of light capable of being emitted from the organic EL element can be widened. Accordingly, a display device using the organic EL element of the present invention in combination with a color filter can increase a degree of freedom of selection of color of light emitted from the organic EL element of the present invention.

The full-color display device of the present invention has the above-described excellent light-emitting characteristics and can be produced by the simple production process. Since the display device is provided with organic EL elements having the same conformation as a pixel, all layers constituting the organic EL elements can be formed by the common process during formation of a plurality of pixels. The respective layers may be easily formed, for example, by the existing thin film forming method such as spin coating method, nozzle coating method, capillary coating method, flexography, and inkjet method. Thus, since it is not necessary to classify by each pixel unit in terms of color, a plurality of organic EL elements can be easily produced. Further, partitions necessary for classification for coating and a formation process thereof are not essential, and precise positioning for classification is not also necessary. If the classification for coating is necessary, defect is possibly caused by poor positioning. However, in the present invention, the precise classification for coating is not required, and therefore defect is not caused by the classification for coating.

The invention claimed is:

1. A single-photon type organic electroluminescent element comprising:
a first electrode having optical transparency;
a second electrode; and
a plurality of light-emitting layers disposed between the first and second electrodes, wherein
the plurality of light-emitting layers stacked between the first and second electrodes each emit light having a different peak wavelength, and
each of the light-emitting layers is disposed separately from the second electrode at such a position that optical resonance is generated by reflected light emitted from a predetermined light-emitting layer toward the second electrode and reflected by the second electrode to return, and light emitting from the predetermined light-emitting layer toward the first electrode,
wherein a distance between a light-emitting center portion of a k-th light-emitting layer, "k" representing a natural number, counted from a side of the first electrode among the plurality of light-emitting layers and a portion of the second electrode which reflects light falls within a range of 0.9 to 1.1 times a resonance distance $d_k$ represented by the following Equation (1):

$$d_k = \frac{m_k \lambda_k}{4n} \qquad \text{[Numerical Formula 1]}$$

wherein $\lambda_k$ represents a peak wavelength of light emitted from the k-th light-emitting layer, n represents an average refractive index of a member placed between the k-th light-emitting layer and the second electrode, and $m_k$ is a positive odd number.

2. The single-photon type organic electroluminescent element according to claim 1, wherein the plurality of light-emitting layers are formed by a coating method.

3. A light-emitting device comprising the single-photon type organic electroluminescent element according to claim 1.

4. A display device comprising the single-photon type organic electroluminescent element according to claim 1 and a color filter disposed at such a position that light emitted from the organic electroluminescent element passes.

5. The single-photon type organic electroluminescent element according to claim 1, wherein any layer that is not a light-emitting layer is not provided between the light-emitting layers.

6. The single-photon type organic electroluminescent element according to claim 1, wherein a light-emitting layer which emits light having a longer peak wavelength among the plurality of light-emitting layers is disposed at a position closer to the first electrode between the first and second electrodes.

7. The single-photon type organic electroluminescent element according to claim 6, wherein the first electrode is an anode and the second electrode is a cathode.

8. The single-photon type organic electroluminescent element according to claim 1, wherein the plurality of light-emitting layers comprise a light-emitting layer which emits red light, a light-emitting layer which emits green light, and a light-emitting layer which emits blue light.

* * * * *